(12) United States Patent
Usuki et al.

(10) Patent No.: US 6,462,374 B2
(45) Date of Patent: Oct. 8, 2002

(54) SEMICONDUCTOR DEVICE AND METHOD FOR FABRICATING THE SAME

(75) Inventors: Tatsuya Usuki, Kawasaki (JP); Naoto Horiguchi, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 09/814,000

(22) Filed: Mar. 22, 2001

(65) Prior Publication Data

US 2002/0003255 A1 Jan. 10, 2002

(30) Foreign Application Priority Data

Jun. 30, 2000 (JP) .................................... 2000-198390

(51) Int. Cl.⁷ .............................................. H01L 29/788
(52) U.S. Cl. ..................... 257/315; 257/314; 257/607; 257/655
(58) Field of Search ................................ 257/314–316, 257/317, 324, 318, 607, 655

(56) References Cited

U.S. PATENT DOCUMENTS 5,408,430 A * 4/1995 Shimoji
6,195,292 B1    2/2001 Usuki et al. ............ 365/185.28
6,232,630 B1 *  5/2001 Ramsbey et al.

FOREIGN PATENT DOCUMENTS

JP       2-295170    * 12/1990
JP       2000-150680    5/2000

* cited by examiner

Primary Examiner—Nathan J. Flynn
Assistant Examiner—Kevin Quinto
(74) Attorney, Agent, or Firm—Armstrong, Westerman & Hattori, LLP

(57) ABSTRACT

To provide a semiconductor device which can retain information for a long period of time even in a case that the tunnel insulation film is thin. A semiconductor device comprises a first insulation film 14 formed on a semiconductor substrate 10, a floating gate electrode 22 formed on the first insulation film, a second insulation 24 film formed on the floating gate electrode, and a control gate electrode 26 formed on the second insulation film. A depletion layer is formed in the floating gate electrode near the first insulation film in a state that no voltage is applied between the floating gate electrode and the semiconductor substrate.

9 Claims, 18 Drawing Sheets

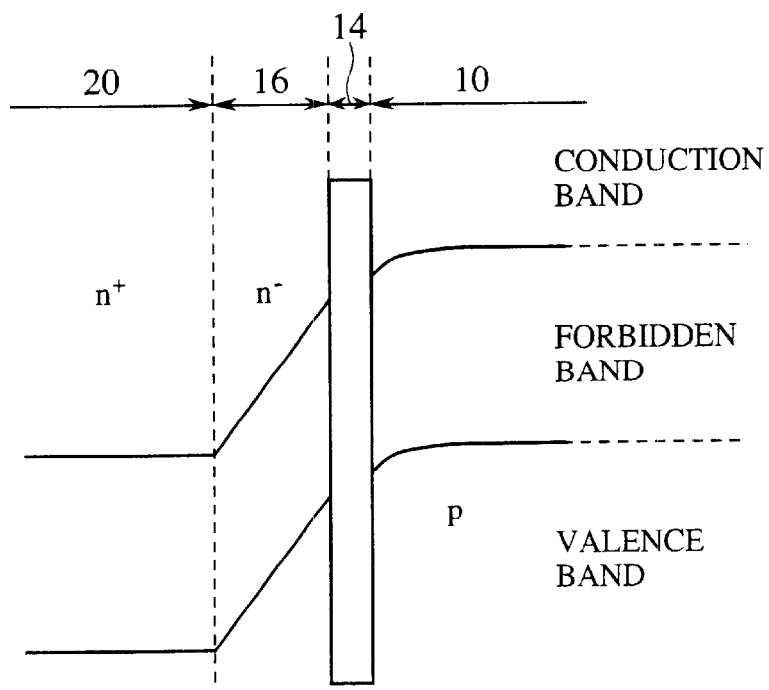
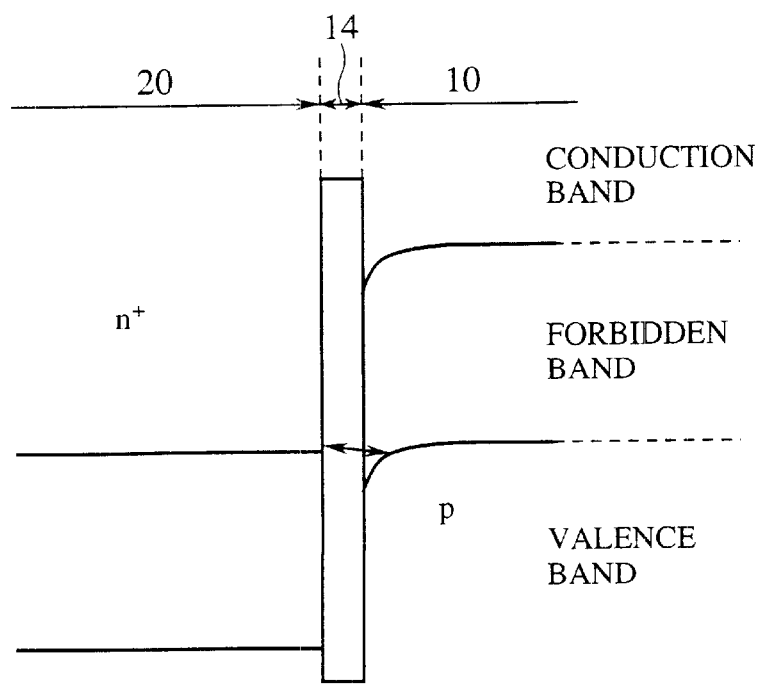

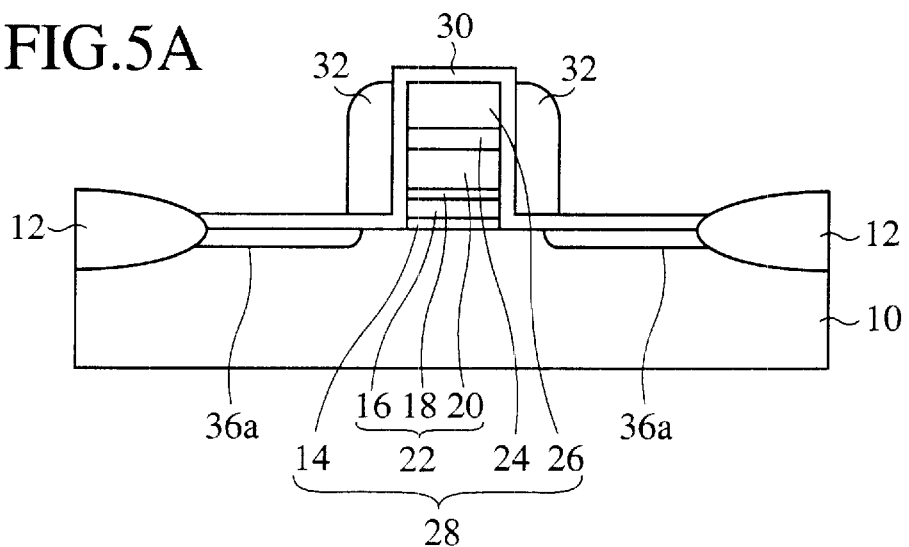
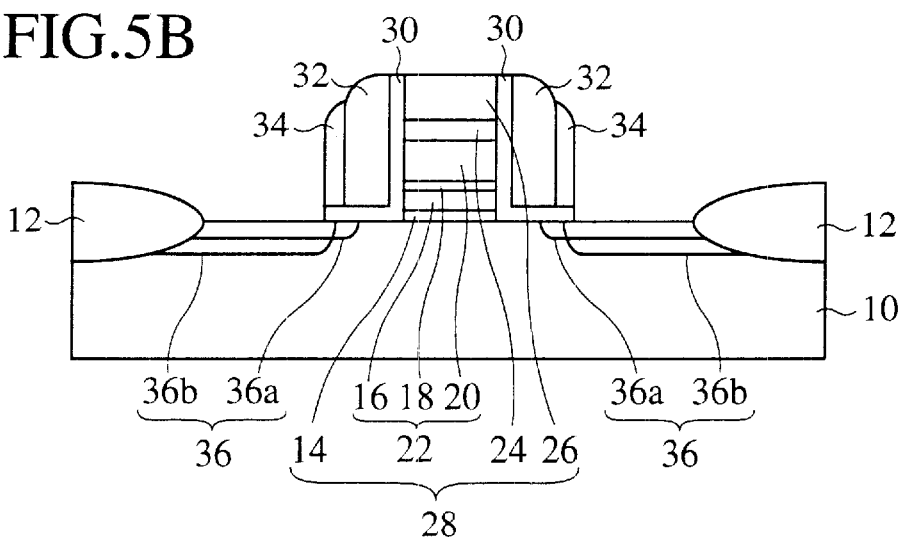
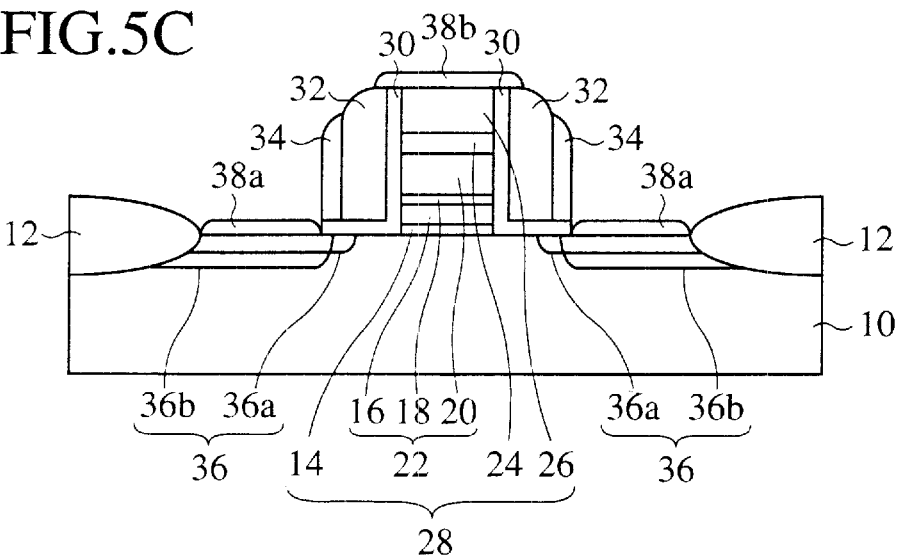

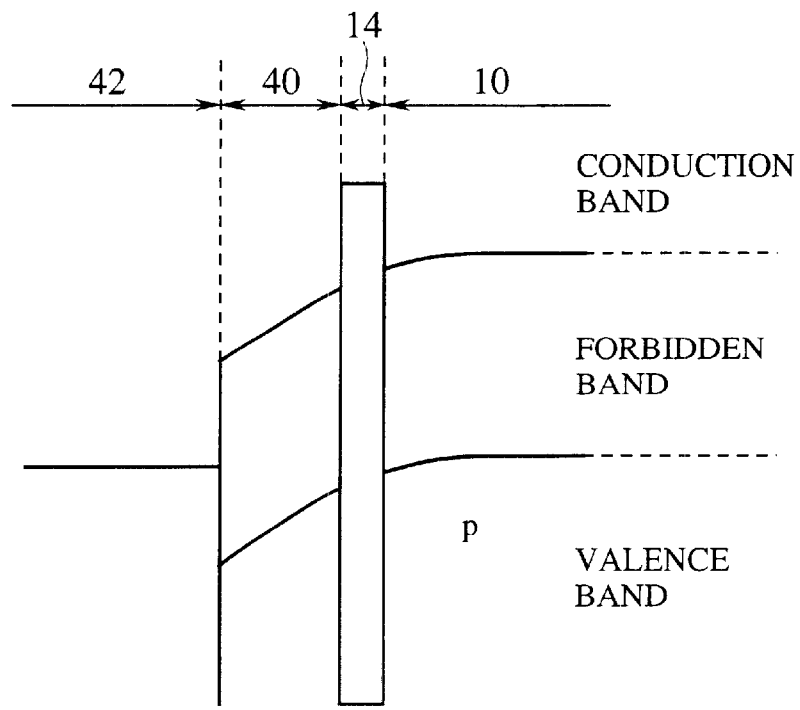
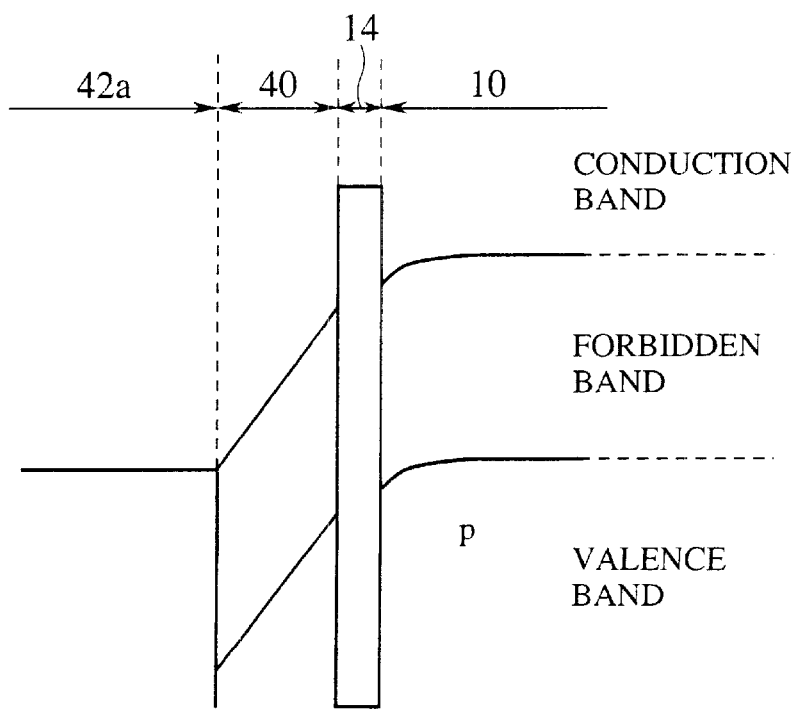

SEMICONDUCTOR DEVICE AND METHOD FOR FABRICATING THE SAME

BACKGROUND OF THE INVENTION

The present invention relates to a semiconductor device and a method for fabricating the semiconductor device, more specifically to a semiconductor device including floating gate electrodes and a method for fabricating the semiconductor device.

As a typical semiconductor memory, DRAM (Dynamic Random Access Memory) is known. DRAM is a semiconductor memory which stores 1-bit information in one memory cell including 1 MISFET and 1 capacitor. DRAM has the memory cells increasingly micronized and the capacities increased. Semiconductor memories which can have larger capacities are expected.

As a semiconductor memory which can increase capacities, flash memories are noted. A flash memory includes memory cells each constituted by only one MISFET, which makes the flash memory suitable for the capacity increase.

In the flash memory, information is stored by injecting carriers into the floating gate electrodes of floating gate-type FETs. For retaining carriers injected in the floating gate electrodes, an insulation film between the floating gate electrodes and the channel region must have a thickness of above about 8 nm.

When carriers are injected into a floating gate electrode, a high voltage is applied between the channel and the floating gate electrode. When a high voltage is applied between the channel region and the floating gate electrode, FN (Fowler-Nordheim) tunnel phenomenon causes carriers to be injected into the floating gate electrode.

However, to inject carriers into a floating gate electrode by FN tunnel phenomenon, a 10 to 20 V voltage is necessary. The conventional flash memory requires application of high voltages, with a result of high electric power consumption.

To enable writing at low voltages it is considered effective to thin a tunnel insulation film between the channel region and the floating gate electrode. Merely thinning the tunnel insulation film, however, allows electrons injected into the floating gate electrode to easily move into the channel region, which makes it difficult to retain information in the floating gate electrode for a long period of time.

SUMMARY OF THE INVENTION

An object of the present invention is to provide a semiconductor device which can retain information for a long period of time even in a case that the tunnel insulation film is thin, and a method for fabricating the semiconductor device.

The above-described object is achieved by a semiconductor device comprising a first insulation film formed on a semiconductor substrate, a floating gate electrode formed on the first insulation film, a second insulation film formed on the floating gate electrode, and a control gate electrode formed on the second insulation film, a depletion layer being formed in the floating gate electrode near the first insulation film in a state that no voltage is applied between the floating gate electrode and the semiconductor substrate. Even in a case that the tunnel insulation film is thin, recombination of the carriers can be prohibited, and the semiconductor device can retain information in the floating gate electrode for a long period of time.

The above-described object is achieved by a method for fabricating a semiconductor device comprising the steps of: forming a first insulation film on a semiconductor substrate; forming a floating gate electrode on the first insulation film; forming a second insulation film on the floating gate electrode; and forming a control gate electrode on the second insulation film, in the step of forming the floating gate electrode, the floating gate electrode being formed so that a depletion layer is formed in the floating gate electrode near the first insulation film in a state that no voltage is applied between the control gate electrode and the semiconductor substrate. Even in a case that the tunnel insulation film is thin, recombination of the carriers can be prohibited, and the semiconductor device which can retain information in the floating gate electrode for a long period of time can be fabricated.

According to the present invention, an impurity concentration of the floating gate electrode is lower near the tunnel insulation film, whereby a thick depletion layer can be formed in the floating gate electrode near the tunnel insulation film. When a thick depletion layer is formed, a conduction band of the floating gate electrode from a valence band of the semiconductor substrate are spaced from each other by the tunnel insulation film and the thick depletion layer, whereby the carriers accumulated in the floating gate electrode cannot easily tunnel toward the semiconductor substrate. Thus, according to the present invention, recombination of the carriers can be prohibited even in a case that the tunnel insulation film is thin, whereby the semiconductor device according to the present invention can retain information in the floating gate electrode for a long period of time.

BRIEF DESCRIPTION OF THE DRAWINGS

FIGS. 2A and 2B are views of energy band structures of the semiconductor device according to the first embodiment of the present invention.

FIGS. 5A to 5C are sectional views of the semiconductor device according to the first embodiment of the present invention in the steps of the method for fabricating the semiconductor device, which show the method (Part 3).

FIGS. 7A and 7B are views of energy band structures of the semiconductor device according to the modification (Part 1) of the first embodiment of the present invention.

DETAILED DESCRIPTION OF THE INVENTION

A First Embodiment

Figure 1:
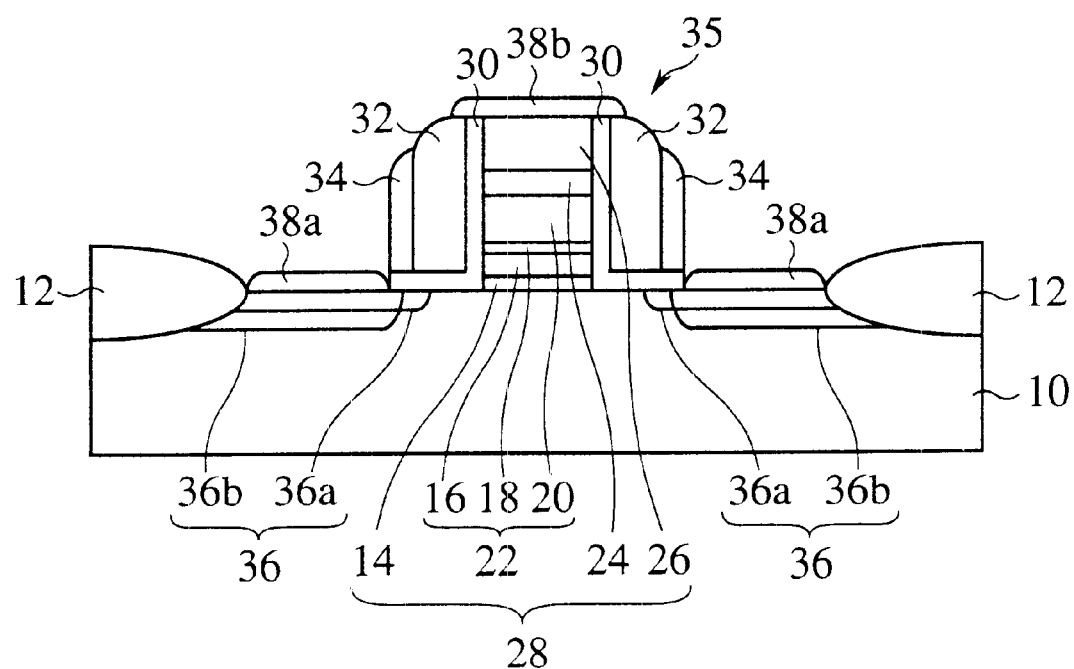
FIG. 1 is a sectional view of the semiconductor device according to a first embodiment of the present invention.

The semiconductor device according to a first embodiment of the present invention and a method for fabricating the semiconductor device will be explained with reference to FIGS. 1 to 5C. FIG. 1 is a sectional view of the semiconductor device according to the present embodiment. FIG. 2A and 2B are views of energy band structures of the semiconductor device according to the present embodiment. FIGS. 3A to 5C are sectional views of the semiconductor device according to the present embodiment in the steps of the method for fabricating the same, which show the method.

As shown in FIG. 1, an element isolation film 12 for defining an element region is formed on a p$^-$ type silicon substrate 10.

A p type impurity is introduced in a surface-neighboring region of the silicon substrate 10 near the surface thereof. Accordingly, an impurity concentration of the surface-neighboring region of the silicon substrate 10 is higher than an impurity concentration of a deeper region of the silicon substrate 10. A p type impurity concentration is made higher in the surface-neighboring region of the silicon substrate 10 because information can be retained by the floating gate electrode 22 for a long period of time. For more detailed mechanism, refer to the specification of Japanese Patent Application No. Hei 10-322034/1998 filed by the Applicant of the present application.

An about 3 nm-thickness tunnel insulation film is formed of a silicon oxide film on the silicon substrate 10. The tunnel insulation film 14 is made as thin as about, 3 nm so that information can be written and erased at low voltages.

A about 20 nm-thickness polysilicon film 16 which is lightly doped with an n type impurity is formed on the tunnel insulation film 14. An impurity concentration of the polysilicon film 16 is, e.g., about 1×10$^{18}$ cm$^{-3}$.

An about 1 nm-thickness diffusion preventing film 18 is formed of a silicon oxide film on the polysilicon film 16.

An about 130 nm-thickness polysilicon film 20 which is heavily doped with an n type impurity is formed on the diffusion preventing film 18. An impurity concentration of the polysilicon film 20 is about 1×10$^{20}$ cm$^{-3}$.

The diffusion preventing film 18 is for depressing diffusion of the n type impurity into the polysilicon film 16 when the n type impurity implanted in the plysilicon film 20 is diffused and activated. The diffusion preventing film 18 has such a small thickness of about 1 nm that the polysilicon film 16 and the polysilicon film 20 are electrically connected to each other.

The layer structure of the polysilicon film 16, the diffusion preventing film 18 and the polysilicon film 20 constitutes the floating gate electrode 22.

A dielectric film 24 of a silicon oxide film is formed on the floating gate electrode 22. The dielectric film 24 has a thickness of, e.g., about 5 to 10 nm.

An upper control gate electrode 26 of a 100 nm-thickness polysilicon film which is heavily doped with an n type impurity is formed on the dielectric film 24. An impurity concentration of the upper control gate electrode 26 is, e.g., about 1×10$^{20}$ cm$^{-3}$.

The tunnel insulation film 14, the floating gate electrode 22, the dielectric film 24 and the upper control gate electrode 26 constitute a layer mesa 28.

A gate insulation film 30 of a silicon oxide film is formed on the side wall of the layer mesa 28 and on the silicon substrate 10 at the periphery of the layer mesa 28. A thickness of the gate insulation film 30 is, e.g., about 5 to 10 nm.

A side control gate electrode 32 of a polysilicon film heavily doped with an n type impurity is formed on the side wall of the layer mesa 28 through the gate insulation film 30. A concentration of the impurity introduced in the side control gate electrode 32 is, e.g., about 1×10$^{20}$ cm$^{-3}$. A side-wise thickness of the side control gate electrode 32 is about 100 nm.

A sidewall insulation film 34 of a silicon oxide film is formed on the side wall of the side control gate electrode 32.

An impurity diffused region 36a constituting a shallow region of an extension source/drain is formed in the silicon substrate 10 outside of the side control gate electrode 32. An impurity diffused region 36b constituting a deep region of an extension source/drain is formed in the silicon substrate 10 outside of the sidewall insulation film 34.

The impurity diffused region 36a and the impurity diffused region 36b constitute the extension source/drain region 36. The source/drain diffused layer 36 is formed in the extension structure for the purpose of preventing punch-through due to short channel effect.

Between both ends of the floating gate electrode 22 and the source/drain diffused layer 36 a gap of, e.g., about 30 nm which does not permit carriers to tunnel through is ensured. Thus, electrons accumulated in the floating gate electrode 22 is prohibited from moving into the source/drain diffused layer 36 due to the tunnel phenomena. For more details, refer to the specification of Japanese Patent Application No. Hei 11-345437/1999 filed by the Applicant of the present application.

A cobalt silicide film 38a is formed on the source/drain diffused layer 36. A cobalt silicide film 38a is formed on the upper control gate electrode 26 and the side control gate electrode 32.

The upper control gate electrode 26 and the side control gate electrode 32 are electrically connected by the cobalt silicide film 38b. The upper control gate electrode 26 and the side control gate electrode 32 constitute a control gate electrode 35.

As described above, the semiconductor device according to the present embodiment is characterized mainly in that an impurity concentration of the floating gate electrode 22 is lower near the tunnel insulation film 14.

That is, in a case that the floating gate electrode is formed of the heavily doped polysilicon film 20, as shown in FIG. 2B, the conduction band of the floating gate electrode neighbors the valence band of the semiconductor substrate with a thin tunnel insulation film therebetween, whereby carriers accumulated in the floating gate electrode can easily tunnel the tunnel insulation film. Accordingly, the carriers easily recombine via the thin tunnel insulation film, and information in the floating gate electrode cannot be retained for a long period of time.

In contrast to the above, in the present embodiment, an impurity concentration of the floating gate electrode 22 is decreased near the tunnel insulation film 14, whereby, as shown in FIG. 2A, a thick depletion layer is formed in the floating gate electrode 22 near the tunnel insulation film 14. When the depletion layer is formed in the floating gate electrode 22, a conduction band of the floating gate electrode and a valence band of the semiconductor substrate are isolated by the tunnel insulation film and the thick depletion layer, whereby the carriers accumulated in the floating gate electrode cannot easily tunnel toward the semiconductor substrate. Thus, according to the present embodiment, even in a case that the tunnel insulation film 14 is thin, recombination of the carriers can be prohibited. The semiconductor device according to the present embodiment can retain information in the floating ate electrode 22 for a long period of time.

In the above, a thickness of the tunnel insulation film 14 is about 3 nm, but is not essentially limited to 3 nm. In the present embodiment, a depletion layer which can prohibit recombination of the carriers is formed in the floating gate electrode 22 near the tunnel insulation film 14, whereby a memory cell transistor having the tunnel insulation film whose thickness is below 8 nm, which has been impossible in the conventional structure, can be fabricated.

In the above, an impurity concentration of the polysiclion film 16 is about $1 \times 10^{18}$ cm$^{-3}$, but is not essentially limited to about $1 \times 10^{18}$ cm$^{-3}$. An impurity concentration of the polysilicon film 16 can be set in a range of, e.g., $1 \times 10^{17}$ to $1 \times 10^{20}$ cm$^{-3}$.

In the above, a thickness of the polysilicon film 16 is about 20 nm, but is not essentially limited to 20 nm.

In the above, an impurity concentration of the polysiclion film 20 is about $1 \times 10^{20}$ cm$^{-3}$, but is not essentially limited to about $1 \times 10^{20}$ cm$^{-3}$. An impurity concentration of the polysilicon film 20 can be set in a range of, e.g., $1 \times 10^{18}$ to $1 \times 10^{21}$ cm$^{-3}$. However, an impurity concentration of the polysiclicon film 20 is set to be higher than that of the polysiclicon film 16.

In the above, an impurity concentration of the upper control gate electrode 26 is about $1 \times 10^{20}$ cm$^{-3}$, but is not essentially limited to $1 \times 10^{2}$ cm$^{-3}$. An impurity concentration of the upper control gate electrode 26 can be suitably set in a range of, e.g., $1 \times 10^{19}$ to $1 \times 10^{21}$ cm$^{-3}$.

In the above, an impurity concentration of the side control gate electrode 32 is about $1 \times 10^{20}$ cm$^{-3}$, but is not essentially limited to $1 \times 10^{20}$ cm$^{-3}$. An impurity concentration of the side control gate electrode 32 can be suitably set in a range of, e.g., $1 \times 10^{19}$ to $1 \times 10^{21}$ cm$^{-3}$.

Next, the method for fabricating the semiconductor device according to the present embodiment will be explained with reference to FIGS. 3A to 5C.

Figure 3A:
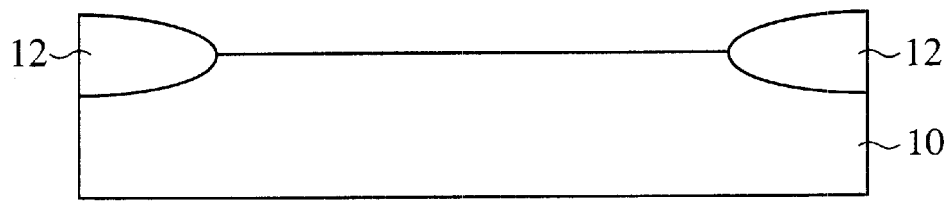
FIGS. 3A to 3C are sectional views of the semiconductor device according to the first embodiment of the present invention in the steps of the method for fabricating the semiconductor device, which show the method (Part 1).

First, as shown in FIG. 3A, the element isolation film 12 for defining an element region is formed on the surface of a p$^-$ type silicon substrate 10 by thermal oxidation.

Then, B (Boron) ions are implanted in all the surface neighboring region of the silicon substrate 10 near the surface thereof. Ion implanting conditions are, e.g., 10 keV acceleration energy and a $2 \times 10^{13}$ cm$^{-2}$ dose, and an impurity concentration of the silicon substrate 10 near the surface-neighboring region can be higher than that of a deeper region of the silicon substrate 10.

Figure 3B:
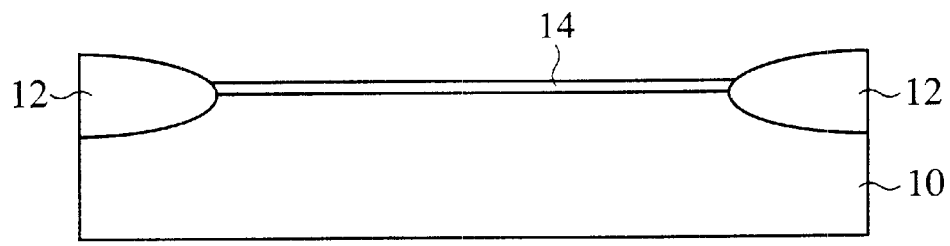

Next, the tunnel insulation film 14 is formed of a 3 nm-thickness silicon oxide film on the entire surface by thermal oxidation (see FIG. 3B).

Then, the polysilicon film 16 of a 20 nm-thickness which is not doped is formed on the entire surface by CVD (Chemical Vapor Deposition).

Next, the surface of the polysilicon film 16 is oxidized by nitric acid to form the diffusion preventing film 18 of an about 1 nm-thickness silicon oxide film on the surface of the polysilicon film 16.

Then, the polysilicon film 20 of a 130 nm-thickness is formed on the entire surface by CVD.

Next, an n-impurity is introduced into the polysilicon film 20 by ion-implantation. At this time, it is preferable that the n-impurity is implanted into the polysilicon film 20 alone but is not implanted into the polysilicon film 16.

In order to implant an n-impurity into the polysilicon film 20 alone without implanting the impurity into the polysilicon film 16, the impurity has a relatively large mass. Specifically, As (Arsenic) ions can be used. As ions, the mass of which is larger than that of P (Phosphorus) ions, can be implanted in a region which is nearer the surface of the polysilicon film 20.

Conditions for implanting As ions can be, e.g., 40 keV acceleration energy and a $2 \times 10^{15}$ cm$^{-2}$ dose. Under these ion implanting conditions, the impurity can be implanted in a region which is nearer the surface of the polysilicon film 20.

The ion implanting conditions are not limited to the above and can be suitably set. An impurity is not limited to As ions and can be suitably other impuritys.

Then, thermal processing is performed to diffuse and activate the impurity implanted in the polysilicon film 20. At this time, the diffusion preventing film 18 prohibits the impurity in the polysilicon film 20 from being diffused into the polysilicon film 16. A concentration of the n type impurity of the polysilicon film 20 is about $1 \times 10^{20}$ cm$^{-3}$, and a concentration of the n-impurity of the polysilicon film 16 is sustained to be as low as about $1 \times 10^{18}$ cm$^{-3}$ (see FIG. 3C).

Then, dielectric film 24 of a 5 to 10 nm-thickness silicon oxide film is formed on the entire surface by thermal oxidation.

Next, the polysilicon film 25 of an 100 nm-thickness doped with an about $1 \times 10^{20}$ cm$^{-3}$ of As on the entire surface by CVD.

Figure 4A:
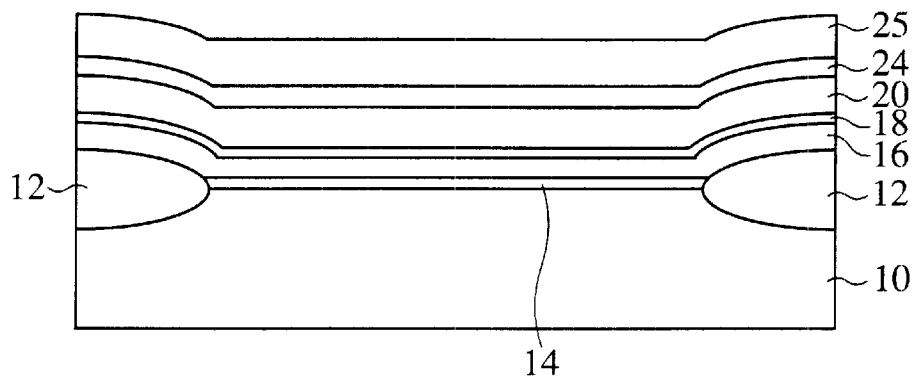
FIGS. 4A to 4C are sectional views of the semiconductor device according to the first embodiment of the present invention in the steps of the method for fabricating the semiconductor device, which show the method (Part 2).
Figure 4B:
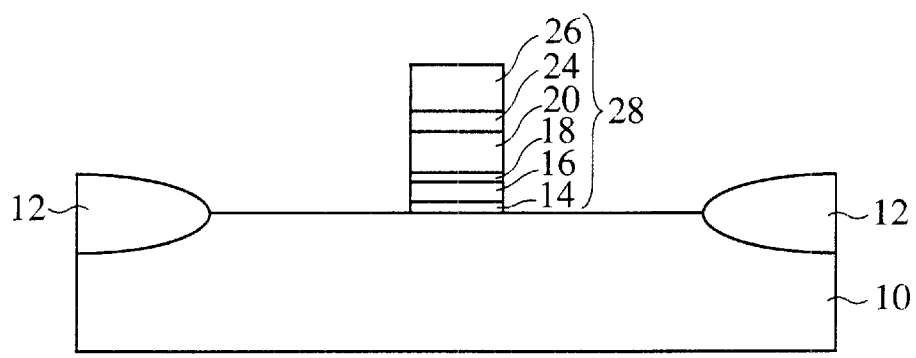

Then, the polysilicon film 25, the dielectric film 24, the polysilicon film 20, the diffusion preventing film 18, the polysilicon film 16 and the tunnel oxidation film 14 are patterned by lithography to form the layer mesa 28 (see FIG. 4B).

Next, the gate insulation film 30 is formed of a 5 to 10 nm-thickness silicon oxide film on the entire surface by thermal oxidation.

Figure 4C:
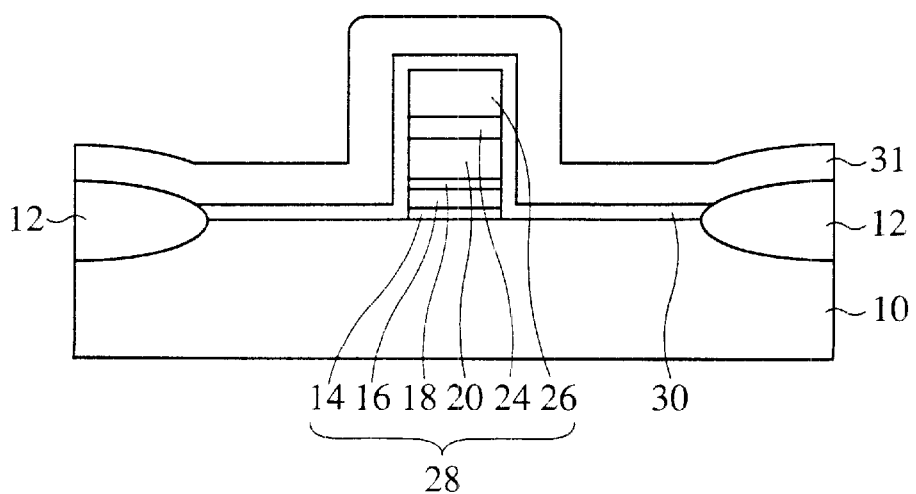

Then, a 100 nm-thickness polysilicon film 31 doped with an about $1 \times 10^{20}$ cm$^{-3}$ concentration of As is formed on the entire surface by CVD (see FIG. 4C).

Then, the polysilicon film 31 is anisotropically etched to form the side control gate electrode 32 of the polysilicon film 31 on the side wall of the layer mesa 28.

Next, As ions are implanted to form the impurity diffused region 36*a* forming a region of the extension source/drain structure which is nearer the surface thereof. Conditions for the ion implantation are, e.g., 5 keV acceleration energy and a $1 \times 10^{13}$ cm$^{-3}$ dose. The impurity diffused layer 36*a* is formed by introducing the impurity after the side control gate electrode 32 has been formed, whereby the impurity diffused region 36*a* can be formed, spaced from the floating gate electrode 22 (see FIG. 5A).

Then, a 50 nm-thickness silicon oxide film is formed on the entire surface by CVD. Then, the silicon oxide film is anisotropically etched to form the sidewall insulation film 34 of the silicon oxide film on the side wall of the side control gate electrode 32.

Then, As ions are introduced by ion implantation to form the impurity diffused region 36*b* which forms a deeper region of the extension source/drain structure. Conditions for the ion implantation are, e.g., 40 keV and a $\times 10^{14}$ cm$^{-3}$ dose (see FIG. 5B)

Next, the cobalt silicide films 38*a*, 38*b* are formed on the source/drain region 36, the upper control. gate electrode 26 and the side control gate electrode 32 by salicide process (see FIG. 5C).

Thus, the semiconductor device according to the present embodiment is fabricated.

(Modification 1)

Figure 6:
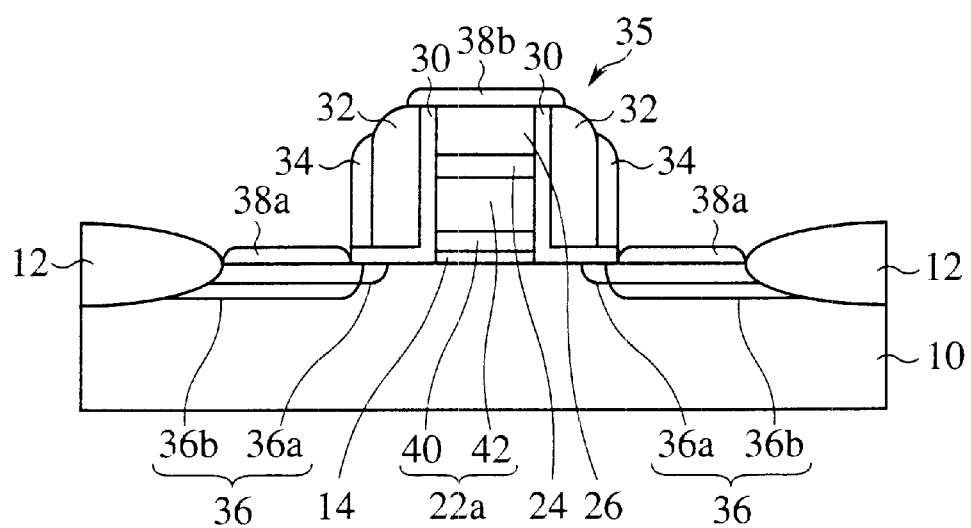
FIG. 6 is a sectional view of the semiconductor device according to a modification (Part 1) of the first embodiment of the present invention.
Figure 8A:
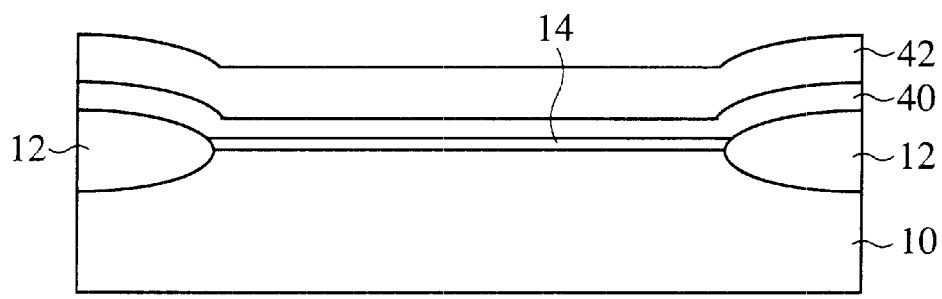
FIGS. 8A and 8B are sectional views of the semiconductor device according to the modification (Part 1) of the first embodiment of the present invention in the steps of the method for fabricating the semiconductor device, which show the method.
Figure 8B:
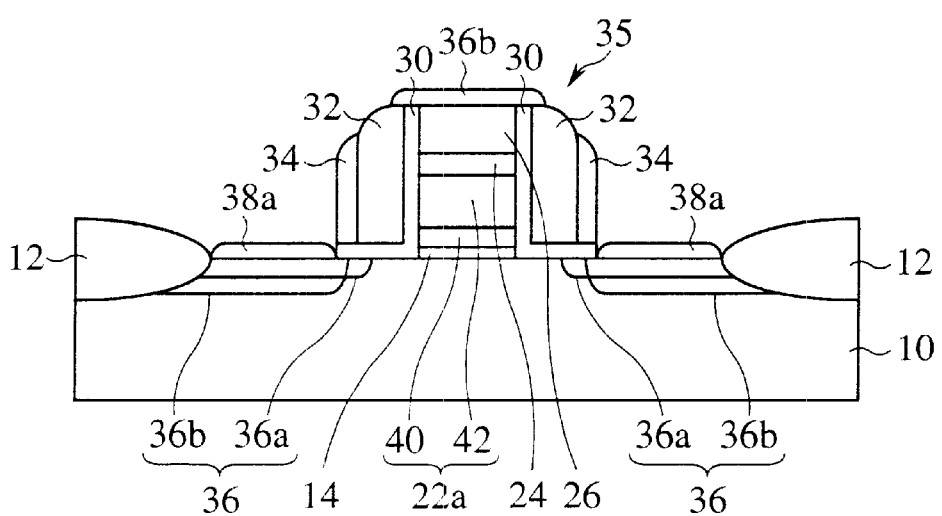

Next, the semiconductor device according to Modification 1 of the present embodiment and the method for fabricating the semiconductor device will be explained with reference to FIGS. 6 to 8B. FIG. 6 is a sectional view of the semiconductor device according to the present modification. FIGS. 7A and 7B are view of energy band structures of the semiconductor device according to the present modification. FIGS. 8A and 8B are views of the semiconductor device according to the present modification in the steps of the method for fabricating the semiconductor device, which show the method.

As shown in FIG. 6, a intrinsic semiconductor film, specifically an undoped polysilicon film 40 is formed on a tunnel insulation film 14. A thickness of the polysilicon film 40 is, e.g., about 20 nm.

A metal film 42 is formed on the polysilicon film 40. The metal film 42 is formed by forming a 10 nm-thickness TiN film and a 100 nm-thickness tungsten film laid one on another.

The polysiclicon film 40 and the metal film 42 constitute a floating gate electrode 22*a*.

The semiconductor device according to the present modification is characterized mainly in that the floating gate electrode 22*a* is formed of the polysilicon film 40 which is a intrinsic semiconductor, and the metal film 42.

The semiconductor device according to the present modification including the floating gate electrode 22*a* formed of the polysilicion film 40 and the metal film 42 has the energy band structures shown in FIG. 7A. That is, the polysilicon film 40, which is a intrinsic conductor, form a thick deletion layer. Accordingly, the present modification can prohibit recombination of the carriers, as can the semiconductor device according to the first embodiment shown in FIG. 1. Accordingly, information can be retained in the floating gate electrode 22*a* for a long period of time.

The metal film is not limited to the above-described materials and may be formed suitably of, e.g., the metal materials used in the metal gate electrodes of MOS transistors, specifically Al, etc. In a case that the metal film 42*a* of Al is formed on the polysilicon film 40, the energy band structure is as shown in FIG. 7B.

Next, the method for fabricating the semiconductor device according to the present modification will be explained with reference to FIGS. 8A and 8B.

The method for fabricating the semiconductor device according to the present modification is the same up to the step of forming the tunnel insulation film 14 including the same as the method for fabricating the semiconductor device according to the first embodiment shown in FIGS. 3A and 3B, and the explanation will be omitted.

Next, a 20 nm-thickness undoped polysilicon film 40 is formed on the entire surface by CVD.

Then, a 10 nm-thickness TiN film is formed on the entire surface by sputtering. Next, a 100 nm-thickness tungsten film is formed on the entire surface by sputtering. Thus, the metal film 42 is formed of the TiN film and the tungsten film (see FIG. 8A).

The following steps of the method for fabricating the semiconductor device according to the present modification are the same as those of the method for fabricating the semiconductor device according to the first embodiment shown in FIGS. 4A to 5C, and the explanation will be omitted.

Thus, the semiconductor device according to the present modification is fabricated (see FIG. 8B).

(Modification 2)

Figure 9:
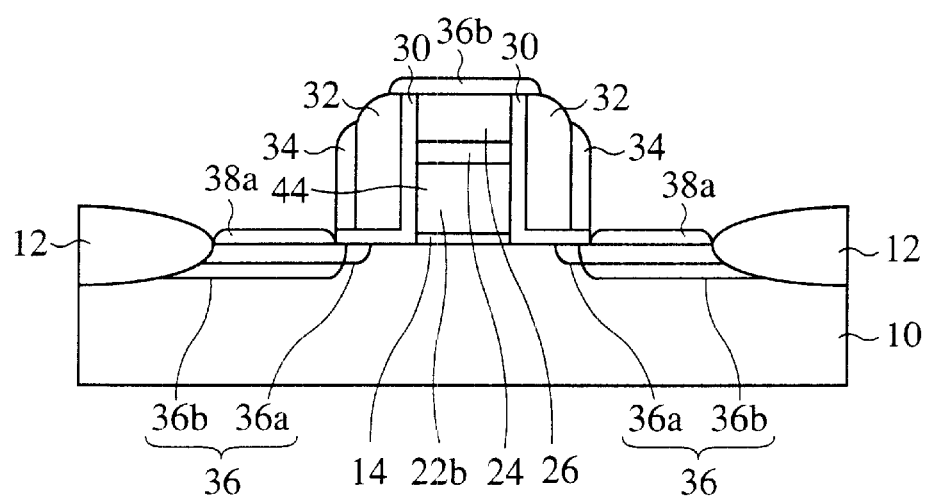
FIG. 9 is a sectional view of the semiconductor device according to a modification (Part 2) of the first embodiment of the present invention.
Figure 10A:
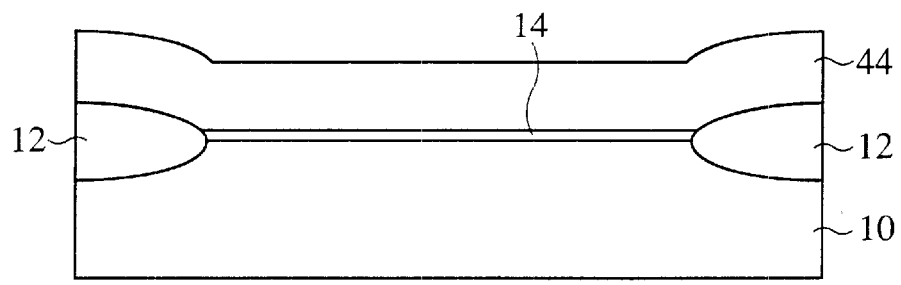
FIGS. 10A and 10B are sectional views of the semiconductor device according to the modification (Part 2) of the first embodiment in the steps of the method for fabricating the semiconductor device, which show the method.
Figure 10B:
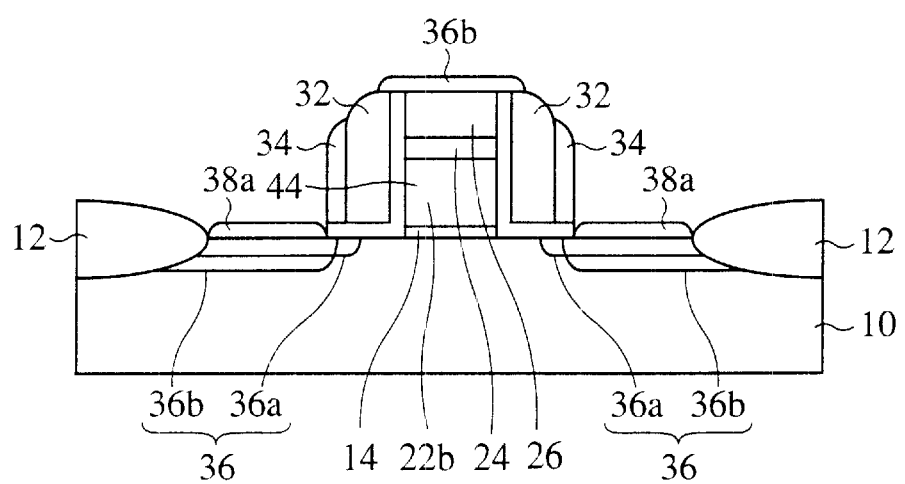

Next, the semiconductor device according to Modification 2 of the first embodiment and the method for fabricating the semiconductor device will be explained with reference to FIGS. 9 and 10B. FIG. 9 is a sectional view of the semiconductor device according to the present modification. FIGS. 10A and 10B are sectional views of the semiconductor device according to the present modification in the steps of the method for fabricating the semiconductor device, which show the method.

As shown in FIG. 9, a floating gate electrode 22*b* of a polysilicon film 44 which is lightly doped with an n type impurity is formed on a tunnel insulation film 14. A thickness of the polysilicon film is, e.g., about 100 nm. An impurity concentration of the polysilicon film 44 is, e.g., about $1 \times 10^{18}$ cm$^{-3}$.

The semiconductor device according to the present modification is characterized mainly in that the floating gate electrode 22*b* is formed of the lightly doped polysilicon film 44.

In the present modification, in which the floating gate electrode 22*b* is formed of the lightly doped polysilicon film 44, a thick depletion layer is formed in the floating gate electrode 22*b* near the tunnel insulation film 14. Accordingly, in the present modification, recombination of the carriers can be prohibited, as can be in the semiconductor device according to the first embodiment shown in FIG. 1, and information in the floating gate electrode 22*b* can be retained for a long period of time.

In the above, an impurity concentration of the polysilicon film 44 is about $1 \times 10^{18}$ cm$^{-3}$, but is not essentially limited to about $1 \times 10^{18}$ cm$^{-3}$. An impurity concentration of the polysilicon film 44 is suitably set in a range of, e.g., $1 \times 10^{17}$ to $1 \times 10^{20}$ cm$^{-3}$ so that a depletion layer of a thickness which can prohibit recombination of the carriers can be formed in the floating gate electrode near the tunnel insulation film.

Next, the method for fabricating the semiconductor device according to the present modification will be explained with reference to FIGS. 10A and 10B.

The method for fabricating the semiconductor device according to the present modification is the same up to the step of forming the tunnel insulation film 14 including the same as the method for fabricating the semiconductor device according to the first embodiment shown in FIGS. 3A and 3B, and the explanation will be omitted.

Then, the polysilicon film 44 doped with an about $1\times10^{18}$ cm$^{-3}$ concentration of As is formed in a 100 nm-thickness on the entire surface by CVD.

The method for fabricating the semiconductor device according to the present modification is the same in the following steps as the method for fabricating the semiconductor device according to the first embodiment shown in FIGS. 4A to 5C, and the explanation will be omitted.

Thus, the semiconductor device according to the present modification is fabricated (see FIG. 10B).

A Second Embodiment

Figure 11:
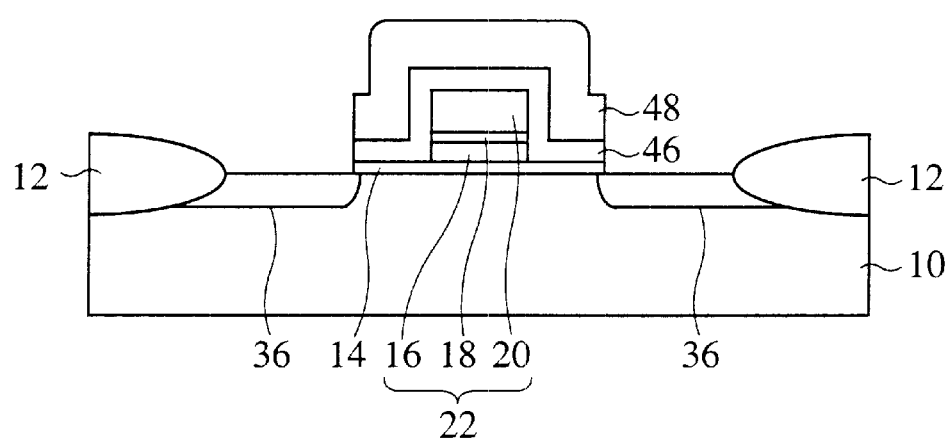
FIG. 11 is a sectional view of the semiconductor device according to a second embodiment of the present invention.

The semiconductor device according to a second embodiment of the present invention, and the method for fabricating the semiconductor device will be explained with reference to FIGS. 11 to 12C. FIG. 11 is a sectional view of the semiconductor device according to the present embodiment. FIGS. 12A to 12C are sectional views of the semiconductor device according to the present embodiment in the steps of the method for fabricating the semiconductor device, which show the method. The same members of the present embodiment as those of the semiconductor device according to the first embodiment and the method for fabricating the semiconductor device are represented by the same reference numbers not to repeat or to simplify their explanation.

As shown in FIG. 11, an about 3 nm-thickness tunnel insulation film 14 is formed of a silicon oxide film on a silicon substrate 10.

The same floating gate electrode 22 as that of the semiconductor device according to the first embodiment shown in FIG. 1 is formed on the tunnel insulation film 14.

A 5 to 10 nm-thickness gate insulation film 46 of a silicon oxide film is formed on the tunnel insulation film 14, and the upper surface and the side wall of the floating gate electrode 22.

A control gate electrode 48 of a 100 nm-thickness heavily n type doped polysilicon film is formed on the gate insulation film 46. An impurity concentration of the control gate electrode 48 is, e.g., about $1\times10^{20}$ cm$^{-3}$.

An n type impurity is introduced in the silicon substrate 10 on both sides of the control gate electrode 48, forming a source/drain diffused layer 36.

The semiconductor device according to the present embodiment is characterized mainly in that the control gate electrode 48 is formed in a width which is sufficiently larger than a width of the floating gate electrode 22. This structure ensures a gap between both ends of the floating gate electrode 22 and the source/drain diffused layer 36, which does not permit carriers tunnel through, whereby electrons accumulated in the floating gate electrode 22 are prohibited from moving into the source/drain diffused layer 36 due to tunnel phenomenon. For more details refer to the specification of Japanese Patent Application No. Hei 10-322034/1998 filed by the Applicant of the present application.

The semiconductor device according to the present emobodiment uses the same floating gate electrode 22 as that of the semiconductor device according to the first embodiment. Accordingly, the semiconductor device according to the present embodiment can retain information in the floating gate electrode 22 for a long period of time, as can the semiconductor device according to the first embodiment.

Next, the method for fabricating the semiconductor device according to the present embodiment will be explained with reference to FIGS. 12A to 12C. FIGS. 12A to 12C are sectional views of the semiconductor device according to the present embodiment in the steps of the method for fabricating the same, which show the method.

Figure 3C:
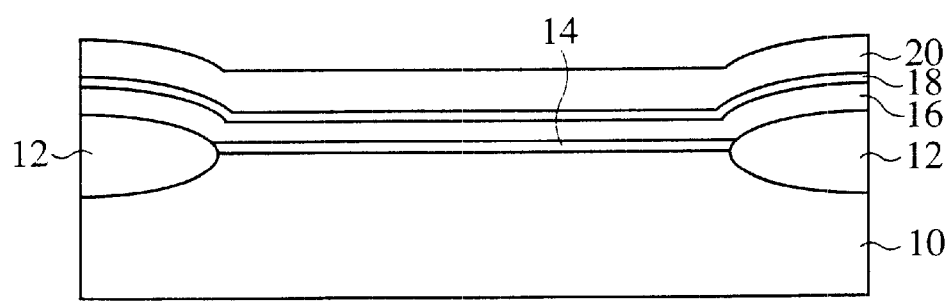

The method for fabricating the semiconductor device according to the present embodiment is the same up to the step of diffusing and activating an impurity introduced in the polysilicon film 20 by thermal processing including the same as the method for fabricating the semiconductor device according to the first embodiment shown in FIGS. 3A to 3C, and the explanation will be omitted.

Figure 12A:
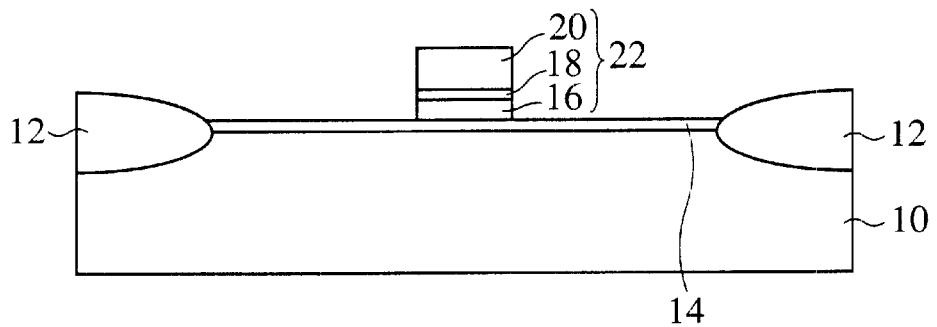
FIGS. 12A to 12C are sectional views of the semiconductor device according to the second embodiment of the present invention in the steps of the method. for fabricating the semiconductor device, which show the method.
Figure 12B:
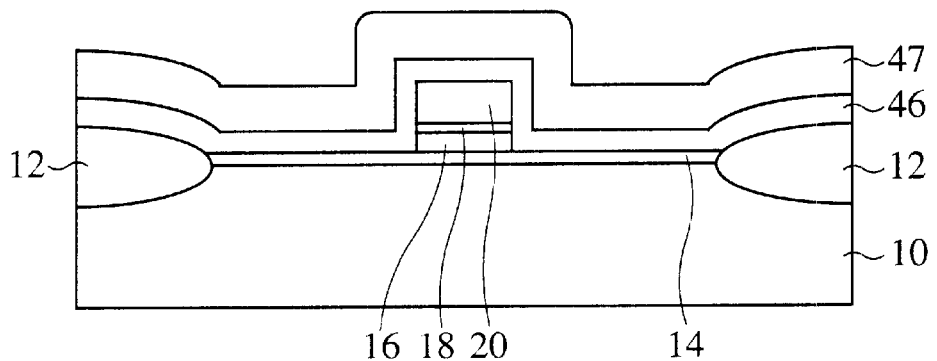
Figure 12C:
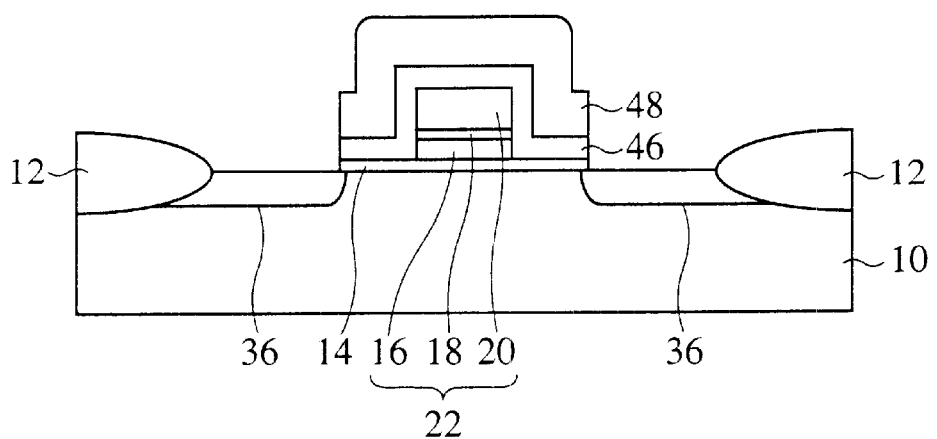

Then, the polysilicon film 20, the diffusion preventing film 18 and the polysilicon film 16 are patterned by photolithography to form the floating gate electrode 22 (see FIG. 12A).

Next, the gate insulation film of a 5 to 10 nm-thickness silicon oxide film is formed on the entire surface by thermal oxidation.

Then, a 100 nm-thickness polysilicon film 47 doped with an about $1\times10^{20}$ cm$^{-3}$ of As is formed on the entire surface by CVD (see FIG. 12B) Next, the polysilicon film 47, the gate insulation film 46 and the tunnel oxide film 14 are patterned by photolithography.

Then, with the control gate electrode 48 as a mask, As ions are introduced by ion implantation to form the source/drain diffused layer 36. The source/drain diffused layer 36 is formed by self-alignment with the control gate electrode 48 of a width which is sufficiently larger than that of the floating gate electrode 22, whereby the impurity diffused region 36 can be formed, spaced from the floating gate electrode 22 (see FIG. 12C).

Thus, the semiconductor device according to the present embodiment is fabricated.

(Modification 1)

Figure 13:
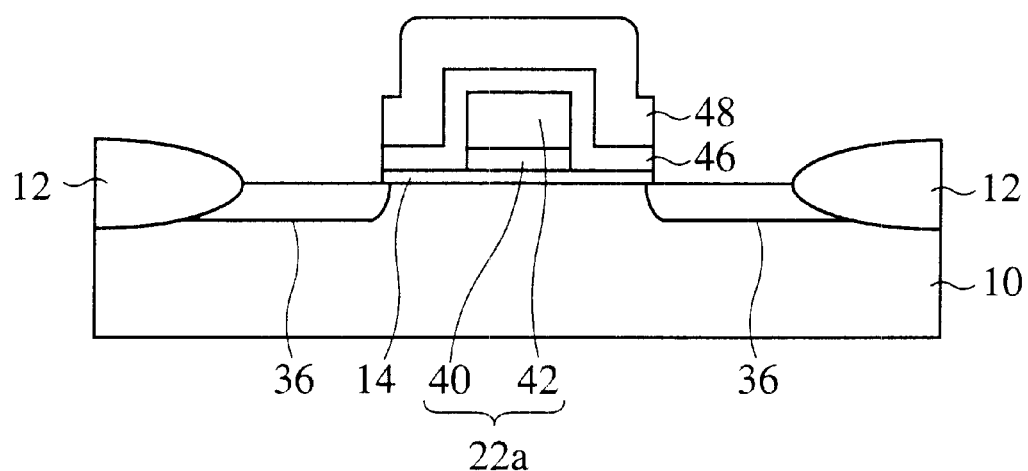
FIG. 13 is a sectional view of the semiconductor device according to a modification (Part 1) of the second embodiment of the present invention.

The semiconductor device according to Modification 1 of the present embodiment will be explained with reference to FIG. 13. FIG. 13 is a sectional view of the semiconductor device according to the present modification.

The semiconductor device according to the present modification is characterized mainly in that the floating gate electrode 22a is formed of the polysilicon film 40 which is a intrinsic semiconductor, and the metal film 42. That is, the semiconductor device according to the present modification uses the same floating gate electrode 22a which the same as the floating gate electrode 22a of the semiconductor device according to Modification 1 of the first embodiment.

As described above, even in a case that the floating gate electrode 22a is formed of the polysilicon film 40 which is a intrinsic semiconductor, and the metal film 42, the same semiconductor device as that according to the second embodiment shown in FIG. 11 can be provided.

(Modification 2)

Figure 14:
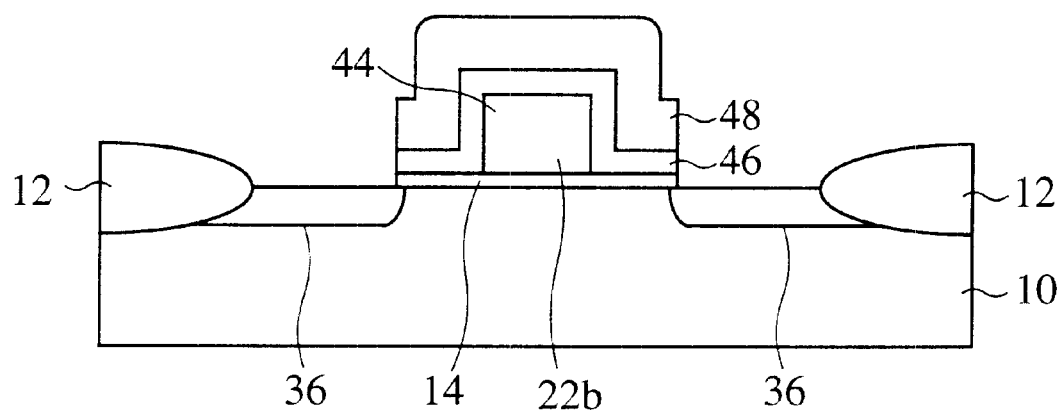
FIG. 14 is a sectional view of the semiconductor device according to a modification (Part 2) of the second embodiment of the present invention.

Next, the semiconductor device according to Modification 2 of the present embodiment will be explained with reference to FIG. 14. FIG. 14 is a sectional view of the semiconductor device according to the present modification.

The semiconductor device according to the present modification is characterized mainly in that a floating gate electrode 22b is formed of a lightly doped polysilicon film 44. That is, the semiconductor device according to the present modification uses the same floating gate electrode 22b used in the semiconductor device according to Modification 2 of the first embodiment.

As described above, even in a case that the floating gate electrode 22b is formed of the lightly doped polysilicon film 44, the same semiconductor device as that according to the second embodiment shown in FIG. 11 can be provided.

An impurity concentration of the polysilicon film 44 is $1\times10^{17}$ to $1\times10^{20}$ cm$^{-3}$, whereby a depletion layer of a thickness which can prohibit recombination of the carriers can be formed in the floating gate electrode near the tunnel insulation film.

A Third Embodiment

Figure 15:
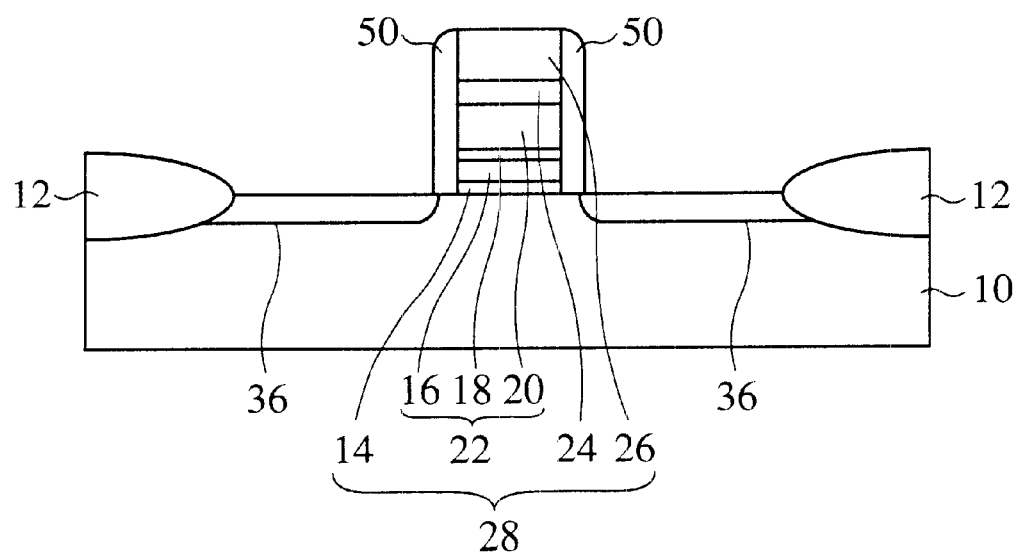
FIG. 15 is a sectional view of the semiconductor device according to a third embodiment of the present invention.

The semiconductor device according to a third embodiment of the present invention will be explained with reference to FIGS. 15 to 16C. FIG. 15 is a sectional view of the semiconductor device according to the present embodiment. FIGS. 16A to 16C are sectional views of the semiconductor device according to the present embodiment in the steps of the method for fabricating the same, which show the method. The same members of the present embodiment as those of the semiconductor device according to the first or the second embodiment shown in FIGS. 1 to 14 and the method for fabricating the semiconductor device are represented by the same reference numbers not to repeat or to simplify their explanation.

As shown in FIG. 15, a 4 nm-thickness tunnel insulation film 14 of silicon oxide film is formed on a silicon substrate 10.

On the tunnel insulation film 14, the same floating gate electrode 22 as that of the semiconductor device according to the first embodiment shown in FIG. 1 is formed.

A 5 to 10 nm-thickness gate insulation film 24 is formed of a silicon oxide film on the floating gate electrode 22.

On the gate insulation film 24, a control gate electrode 26 is formed of a 100 nm-thickness polysilicon film heavily doped with an n type impurity. An impurity concentration of the control gate electrode 26 is, e.g., about $1\times10^{20}$ cm$^{-3}$.

The tunnel insulation film 14, the floating gate electrode 22 and the gate insulation film 24 and the control gate electrode 26 constitute a layer mesa 28.

A sidewall insulation film 50 is formed of a silicon oxide film on the side wall of the layer mesa 28.

An n type impurity is introduced in the silicon substrate 10 on both side of the layer mesa 28 with the sidewall insulation film 50 formed on, forming a source/drain diffused layer 36.

In the semiconductor device according to the present embodiment, both ends of the floating gate electrode 22 and the source/drain diffused layer 36 are near each other, but the tunnel oxide film 14 is made as thick as 4 nm, whereby the carriers accumulated in the floating gate electrode 22 can be prohibited from moving into the source/drain diffused layer 36.

The semiconductor device according to the present embodiment uses the floating gate electrode 22 which is the same as that used in the semiconductor device according to the first embodiment, whereby the semiconductor device according to the present embodiment can retain information in the floating gate electrode 22 for a long period of time, as can the semiconductor device according to the first embodiment.

Next, the method for fabricating the semiconductor device according to the present embodiment will be explained with reference to FIGS. 16A to 16C.

The method for fabricating the semiconductor device according to the present embodiment is the same up to the step of introducing Boron ions including the same as the method for fabricating the semiconductor device according to the first embodiment shown in FIG. 3A, and the explanation will be omitted.

Figure 16A:
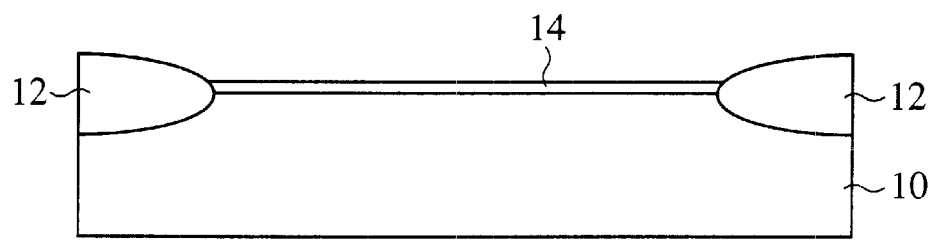
FIGS. 16A to 16C are sectional views of the semiconductor device according to the third embodiment of the present invention in the steps of the method for fabricating the semiconductor device, which show the method.
Figure 16B:
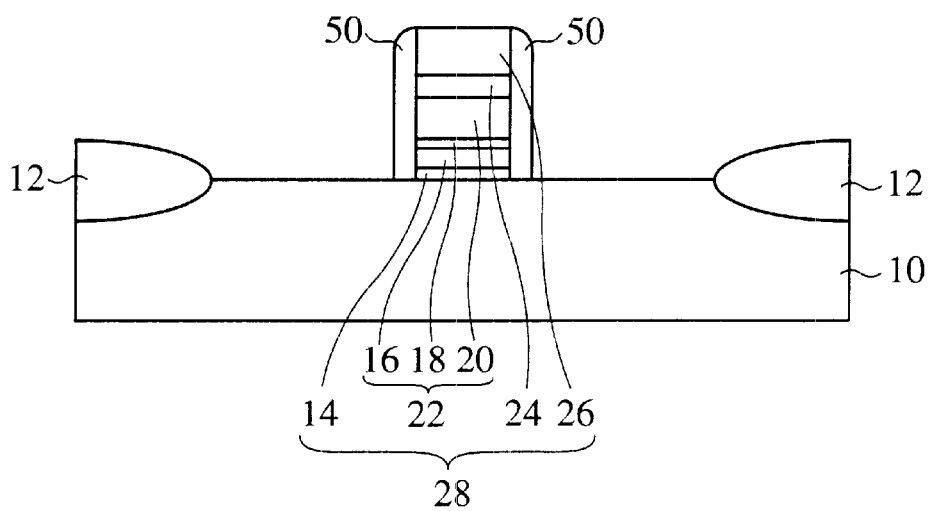

Next, the tunnel insulation film 14 is formed of a 4 nm-thickness silicon oxide film on the entire surface by thermal oxidation (see FIG. 16A).

The following steps up to the step of forming the layer mesa 28 are the same as those of the method for fabricating the semiconductor device according to the first embodiment shown in FIGS. 3C to 4B, and the explanation will be omitted.

Next, a 50 nm-thickness silicon oxide film is formed on the entire surface by CVD. Then, the silicon oxide film is anisotropically etched to form the sidewall insulation film 50 of the silicon oxide film on the side wall of the layer meas 28 (see FIG. 16B).

Figure 16C:
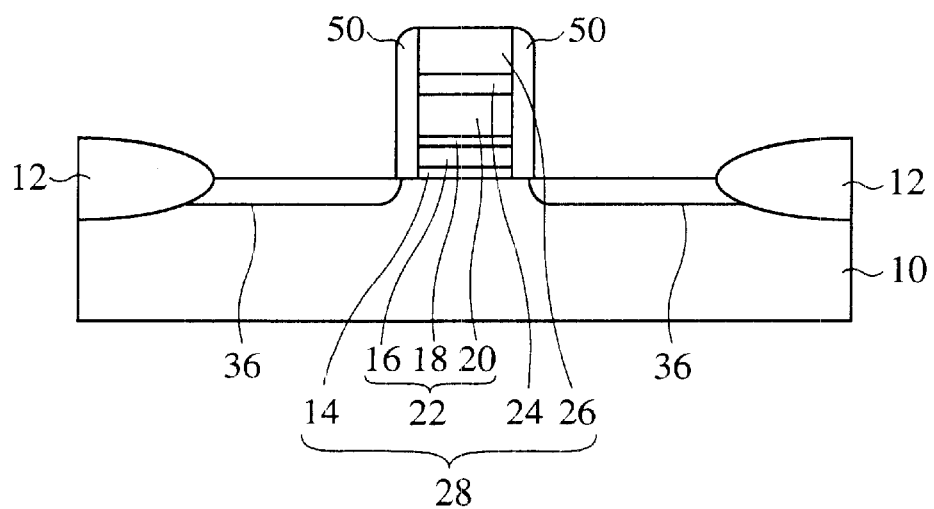

Next, with the layer mesa 28 with the sidewall insulation film 50 formed on the side wall, As ions are introduced into the silicon substrate 10 by ion implantation to form the source/drain diffused layer 36 (see FIG. 16C).

Thus, the semiconductor device according to the present embodiment is fabricated.

(Modification 1)

Figure 17:
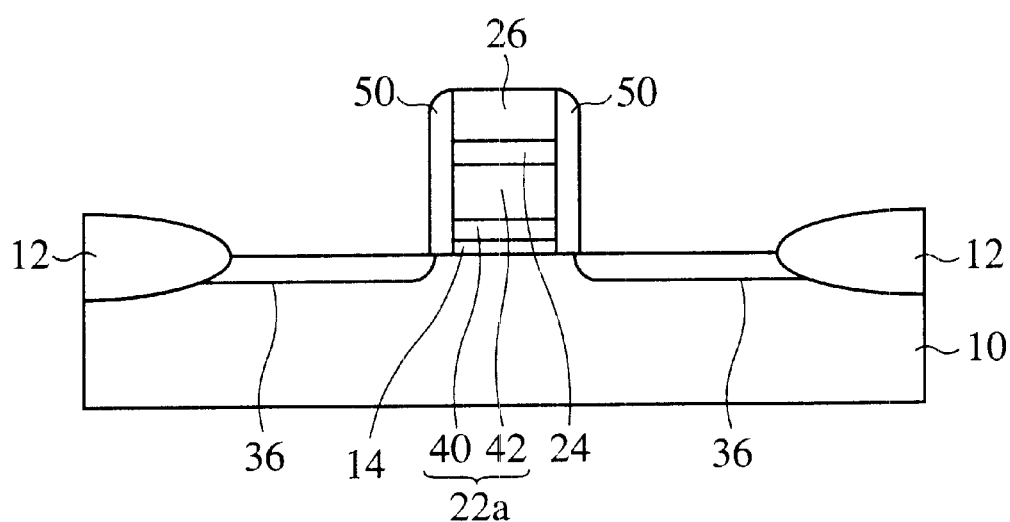
FIG. 17 is a sectional view of the semiconductor device according to a modification (Part 1) of the third embodiment of the present invention.

Next, the semiconductor device according to Modification 1 of the present embodiment will be explained with reference to FIG. 17. FIG. 17 is a sectional view of the semiconductor device according to Modification 1.

The semiconductor device according to the present modification is characterized mainly in that the floating gate electrode 22a is formed of the polysilicon film 40 which is a intrinsic semiconductor, and the metal film 42. That is, the semiconductor device according to the present modification uses the same floating gate electrode 22a which the same as the floating gate electrode 22a of the semiconductor device according to Modification 1 of the first embodiment.

As described above, even in a case that the floating gate electrode 22a is formed of the polysilicon film 40 which is a intrinsic semiconductor, and the metal film 42, the same semiconductor device as that according to the third embodiment shown in FIG. 15 can be provided.

(Modification 2)

Figure 18:
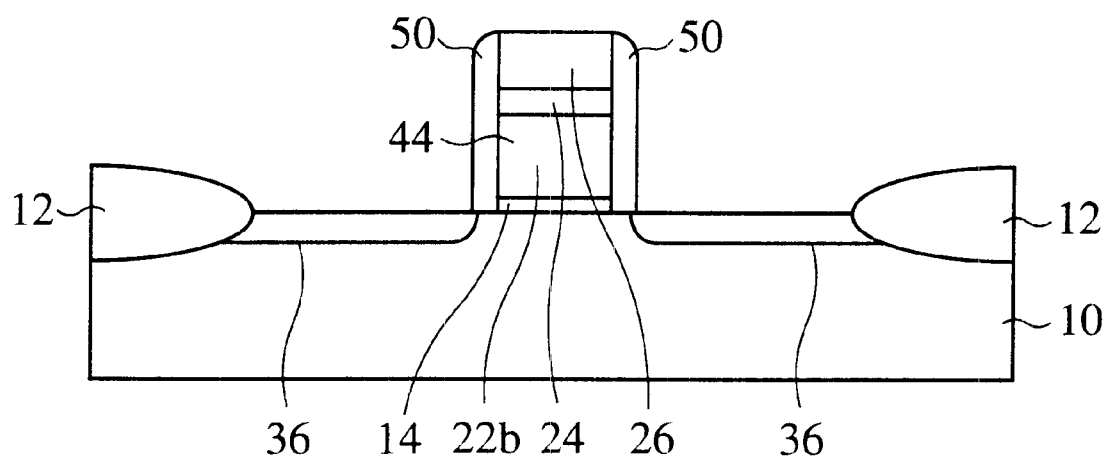
FIG. 18 is a sectional view of the semiconductor device according to a modification (Part 2) of the third embodiment of the present invention.

Next, the semiconductor device according to Modification 2 of the present embodiment will be explained with reference to FIG. 18. FIG. 18 is a sectional view of the semiconductor device according to the present modification.

The semiconductor device according to the present modification is characterized mainly in that a floating gate electrode 22b is formed of a lightly doped polysilicon film 44. That is, the semiconductor device according to the present modification uses the same floating gate electrode 22b used in the semiconductor device according to Modification 2 of the first embodiment.

As described above, even in a case that the floating gate electrode 22b is formed of the lightly doped polysilicon film 44, the same semiconductor device as that according to the third embodiment shown in FIG. 15 can be provided.

An impurity concentration of the polysilicon film 44 is set in a range of $1\times10^{17}$ to $1\times10^{20}$ cm$^{-3}$ whereby a depletion layer of a thickness which can prohibit recombination of the carriers can be formed in the floating gate electrode near the tunnel insulation film.

Modifications

The present invention is not limited to the above-described embodiments and can cover other various modifications.

For example, in the first to the third embodiments, the diffusion preventing film 18 is formed of silicon oxide film but is not essentially limited to silicon oxide film. For example, the diffusion preventing film may be formed of silicon nitride film, and such diffusion preventing film can be formed by NO annealing.

In the first to the third embodiments, the polysilicon film 20 is doped by ion implantation, but the heavily doped polysilicon film 20 may be formed by CVD or others.

In the first to the third embodiments, the floating gate electrode is formed of the lightly-doped polysilicon film 16 and the heavily-doped polysilicon film 20, but the floating gate electrode may be formed essentially of a plurality of polysilicon films. For example, the floating gate electrode may be formed of a polysilicon film having a distribution of impurity concentrations, i.e., a lower impurity concentration near the tunnel insulation film and a higher impurity concentration in a region remote from the tunnel insulation film.

In the semiconductor device according to the second and the third embodiments, the source/drain diffused layer may have the extension source/drain structure.

In the modifications of the first to the third embodiments, the metal film 42 is used, but not only metal film but also silicide film may be used.

The principle of the present invention is applicable to all other semiconductor devices which have a floating gate electrode, e.g. disclosed in the specification of Japanese Patent Application No. Hei 11-345437/1999 filed by the Applicant of the present application.

What is claimed is:

1. A semiconductor device comprising a first insulation film formed on a semiconductor substrate, a floating gate electrode formed on the first insulation film, a second insulation film formed on the floating gate electrode, and a control gate electrode formed on the second insulation film, a depletion layer being formed in the floating gate electrode near the first insulation film in a state that no voltage is applied between the floating gate electrode and the semiconductor substrate.

2. A semiconductor device according to claim 1, wherein the floating gate electrode has in a region near the first insulation film an impurity concentration which is lower than an impurity concentration in a region remote from the first insulation film.

3. A semiconductor device according to claim 1, wherein the floating gate electrode includes a first semiconductor film formed on the first insulation film and doped in a first concentration of an impurity, and a second semiconductor film formed on the first semiconductor film and doped in a second concentration of the impurity higher than the first concentration.

4. A semiconductor device according to claim 2, wherein the floating gate electrode includes a first semiconductor film formed on the first insulation film and doped in a first concentration of an impurity, and a second semiconductor film formed on the first semiconductor film and doped in a second concentration of the impurity higher than the first concentration.

5. A semiconductor device according to claim 3, wherein the floating gate electrode further includes a diffusion preventing film for preventing diffusion of the impurity formed on the first semiconductor film and below the second semiconductor film.

6. A semiconductor device according to claim 1, wherein the floating gate electrode includes a semiconductor film formed on the first insulation film, and a metal film or a silicide film formed on the semiconductor film.

7. A semiconductor device according to claim 1, wherein the floating gate electrode includes a semiconductor film.

8. A semiconductor device according to claim 4, wherein the floating gate electrode further includes a diffusion preventing film for preventing diffusion of the impurity formed on the first semiconductor film and below the second semiconductor film.

9. A semiconductor device according to claim 1, wherein an impurity of a conduction type opposite to that of an impurity implanted in the floating gate electrode is implanted in a region near a surface of the semiconductor substrate below the first insulation film, and wherein a concentration of the impurity of the opposite conduction type in the region near the surface of the semiconductor substrate below the first insulation film is substantially equal to or higher than a concentration of the impurity in a region of the floating gate electrode near the first insulation film.

* * * * *